United States Patent [19]

Webb

[11] 4,277,793
[45] Jul. 7, 1981

[54] PHOTODIODE HAVING ENHANCED LONG WAVELENGTH RESPONSE

[75] Inventor: Paul P. Webb, Beaconsfield, Canada

[73] Assignee: RCA Corporation, New York, N.Y.

[21] Appl. No.: 58,026

[22] Filed: Jul. 16, 1979

[51] Int. Cl.³ .................... H01L 27/14; H01L 29/12
[52] U.S. Cl. ............................. 357/30; 357/13; 357/55; 357/58
[58] Field of Search ................ 357/30, 13, 55, 58

[56] References Cited

U.S. PATENT DOCUMENTS

| | | | |
|---|---|---|---|
| 4,011,016 | 3/1977 | Layne | 356/195 |
| 4,046,594 | 9/1977 | Tarui | 136/89 |
| 4,072,541 | 2/1978 | Meulenberg, Jr. | 136/89 |
| 4,135,950 | 1/1979 | Rittner | 136/89 |

Primary Examiner—Martin H. Edlow
Attorney, Agent, or Firm—Birgit E. Morris; William J. Burke

[57] ABSTRACT

The light entry surface or back surface of an avalanche or p-i-n photodiode is contoured in a regular array of indentations which are hemispherical or almost hemispherical in shape. Light incident on the photodiode undergoes multiple interactions with the contoured surface, thus reducing the entry surface reflectivity and increasing the optical path length in the photodiode, and thereby enhancing its long wavelength response.

9 Claims, 4 Drawing Figures

PHOTODIODE HAVING ENHANCED LONG WAVELENGTH RESPONSE

This invention relates to improved photodiodes. More particularly, this invention relates to a photodiode having reduced reflectivity and enhanced long wavelength response.

BACKGROUND OF THE INVENTION

Avalanche and p-i-n photodiodes detect light by absorption of incident light and the detection of the free electrical charge generated in the absorption process. The optical reflectivity of the light entry surface is typically high, thus reducing the fraction of the incident light which actually enters the device and is absorbed. The most common approach to reduce that reflectivity has been to add an anti-reflection coating to the light entry surface.

In a number of materials, silicon in particular, the absorption length for a range of wavelengths is small. Thus, a significant fraction of the light in this wavelength range will not be absorbed before passing through the device. A partial solution to this problem has been to place a reflector on the surface opposed to the entry surface thus reflecting the light back through the sensitive region and doubling the path length for light absorption.

An alternative approach to reduce the incident surface reflectivity and to increase the light path length in the device has been to contour either the entry or back surface or both surfaces of the device. Haynos et al, *Proceedings of the International Conference on Photovoltaic Power Generation,* Hamburg, Germany, pp. 487–500, September, 1974, have disclosed a silicon photovoltaic solar cell in which a high density of tetrahedra with dimensions of about 2 microns in height and 2 microns at their base have been formed on the entry surface of the cell by chemically etching the surface using an anisotropic etchant. Light incident on this tetrahedrally shaped surface is partially transmitted and partially reflected. The portion reflected is then incident on a neighboring tetrahedron and is again partially transmitted and partially reflected. Thus, the incident light undergoes at least two interactions with the entry surface before leaving the device, thus reducing the device reflectivity.

Muller, Technical Digest of the International Devices Meeting, Washington, D.C., December, 1976, pp. 420–423, has disclosed a p-i-n photodiode having a sphere segment grating on the photodiode surface opposed to the light entry surface so that some of the light reflected from the back surface will be scattered at angles greater than the critical angle for total internal reflection and be trapped within the crystal. The sphere segments are pits about 3 microns in diameter and less than 1 micron deep resulting from etching though pinholes statistically distributed in a photoresist layer on the surface. Muller found that a considerable portion of light incident on such a grating is reflected at such an angle that it leaves the photodiode after only one reflection and thus did not provide significant improvement. Muller also disclosed an optimum grating, an asymmetrically grooved surface which is obtained by anisotropic etching of a surface oriented about 10° off of a (111) plane.

These structures provide enhancement of the spectral response. However, in photoconducting devices where an external electrical field is applied, the surface contouring, particularly for the grooves and pyramids, can result in local regions of high electrical field which lead to nonuniformities in the spectral response of the device and to electrical breakdown and noise. Irregularities and nonuniformities in the surface contour will also lead to a nonuniform response across the surface of the device. It would be desirable to provide a photodiode having contoured surfaces without the presence of the nonuniformities and local regions of high electrical field present in the prior art devices.

SUMMARY OF THE INVENTION

A photodiode is comprised of a semiconductor body having two opposed surfaces; regions of first and second conductivity types extending a distance into said first and second opposed surfaces such that said regions of first and second conductivity type do not overlap; and first and second electrically conducting layers overlying portions of said regions of first and second conductivity type to provide electrical contact to said regions. The invention is an improved photodiode wherein a portion of a surface, either the light entry surface or the opposed surface of the photodiode, is contoured in the form of a regular array of indentations extending a distance into the photodiode thereby reducing the reflectivity of the entry surface or increasing the light absorption length in the photodiode.

DETAILED DESCRIPTION OF THE INVENTION

Figure 1:
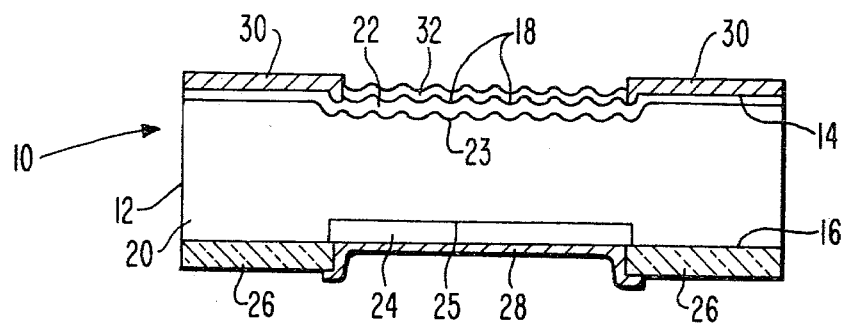
FIG. 1 is a schematic illustration of a cross-sectional view of the p-i-n photodiode of the invention.
Figure 2:
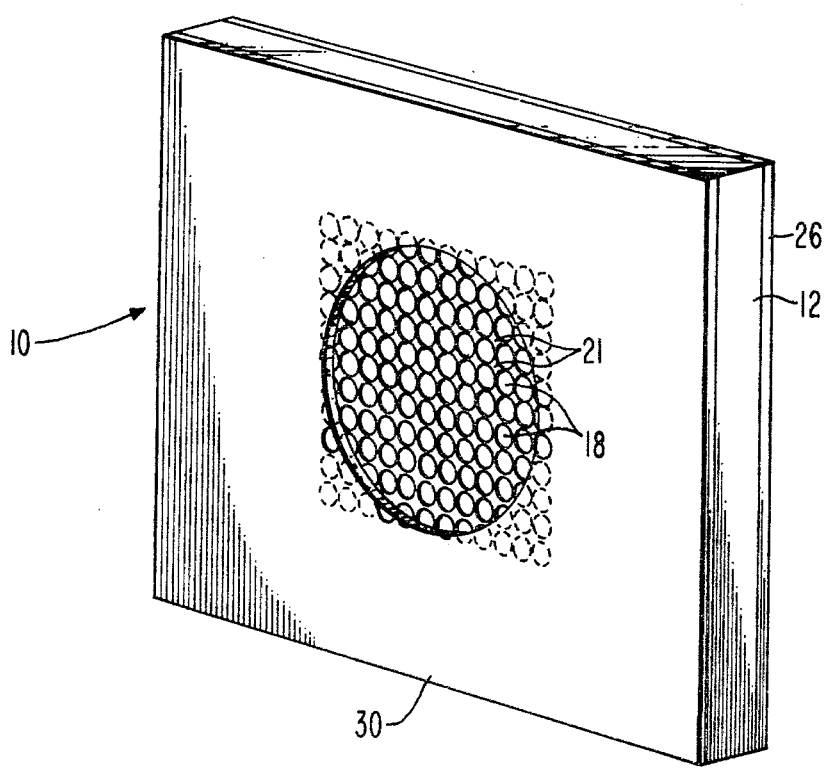
FIG. 2 is a schematic illustration of a top view of the p-i-n photodiode of the invention.

FIGS. 1 and 2 show schematic illustrations of a cross-sectional view and a top view, respectively, of a p-i-n photodiode of the invention. The p-i-n photodiode is comprised of a semiconductor body 12 having opposed surfaces 14 and 16. A portion of the first surface 14 is contoured in a regular array of indentations 18 extending into the semiconductor body 12 from the first surface 14. The semiconductor body 12 is divided into three regions; a low conductivity region 20, a region 22 which is of a first conductivity type and which extends a distance into the semiconductor body 12 from the contoured first surface 14, and a region 24 which is of a second conductivity type opposite to that of region 22 and which extends a distance into the semiconductor body 12 from the second surface 16. Depending upon the conductivity type of the low conductivity region 20, the region 22 of the first conductivity type and the region 24 of the second conductivity type, a p-n junction is formed either at the interface 23 between the region 22 of the first conductivity type and the low conductivity region 20 or at the interface 25 between the region 24 of the second conductivity type and the low conductivity region 20. A passivating layer 26 may overlie a portion of the second surface 16. An electrically conducting layer 28 overlies a portion of the second surface 16 and provides electrical contact to the region 24 of the second conductivity type and may also serve as a light reflector. An electrically conducting layer 30 overlies a portion of the first surface 14 and provides an electrical contact to the region 22 of the first conductivity type. An anti-reflection coating 32 may overlie a portion of the first surface 14 through which light enters the photodiode.

In FIG. 2 the lands 21 between the regular array of indentations 18 are regions where the first major surface 14 has not been perturbed.

Figure 3:
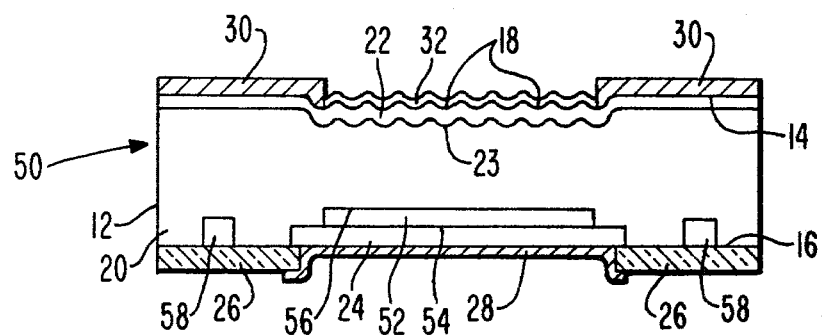
FIG. 3 is a schematic illustration of a cross-sectional view of the avalanche photodiode of the invention.

FIG. 3 is a schematic illustration of a side view of an avalanche photodiode 50. In FIG. 3, parts that are similar to the p-i-n photodiode 10 are labeled similarly. The avalanche photodiode 50 is distinguished from the p-i-n photodiode 10 of FIG. 1 in that (a) a region 52 of a third conductivity type which is opposite to that of the region 24 of a second conductivity type extends into the low conductivity region 20 a distance beyond the region 24 of the second conductivity type and (b) in that the low conductivity region 20, the region 22 of a first conductivity type, and the region 52 of a third conductivity type are all of the same conductivity type. The p-n junction then occurs at the interface 54 between the region 24 of a second conductivity type and the region 52 of a third conductivity type.

A channel stop ring 58 extends a distance into the low conductivity region 20 from the second major surface 16 and extends about the perimeter of, but does not contact, the region 24 of a second conductivity type. The channel stop ring 58 has the same conductivity type as the low conductivity region 20. This stop ring is not required but is typically used to reduce surface leakage currents.

Figure 4:
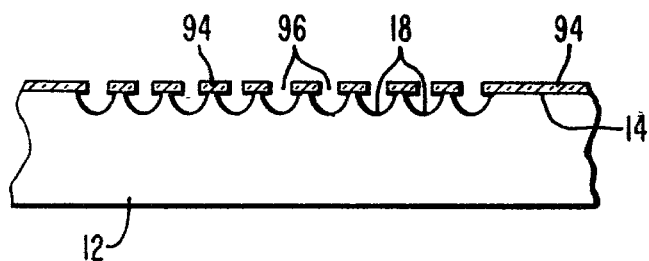
FIG. 4 is a schematic illustration of a cross-sectional view of a semiconductor body during the contouring process.

FIG. 4 shows a schematic illustration of a semiconductor body 12 during the process of formation of the indentations 18 on a major surface 14. A masking layer 94 overlies the surface 14 of the semiconductor body 12. Openings 96 are formed in the masking layer 94. Indentations 18 are etched through these openings into the depth of the semiconductor body and laterally, thus undercutting the masking layer 94.

The low conductivity region 20 may be electrically insulating or slightly conducting. Preferably it is of p-type conductivity silicon having a resistivity of about 3000 ohm-cm.

A regular array of indentations 18 covering a portion or all of the surface 14 of the semiconductor body 12 are formed using etching techniques described below. The indentations 18 typically extend over a portion of the major surface contiguous with the region 22 of the first conductivity type. The center-to-center spacing of the indentations 18 is determined by the mask used to define the openings in the masking layer 94 shown in FIG. 4 and can vary from about 3 microns to about 100 microns but preferably is about 25 microns to 75 microns. The indentations may have a diameter on the first surface 14 less than, equal to, or greater than the center-to-center spacing. Preferably the diameter is greater than the center-to-center spacing; that is, the indentations overlap, producing what is in effect a square pattern with slightly rounded corners and with about ten percent of the original surface area in the lands 21 between the indentations 18.

The indentations 18 are typically hemispherically or almost hemispherically shaped with a depth about equal to the radius of the indentation at the major surface 14. Typical depths range from about 2 to 50 microns and preferably about 12 to about 35 microns. Hemispherically shaped indentations are preferred but not required. Indentations which are not hemispherical, for example about 50 microns in diameter and about 12 to 15 microns in depth, have given satisfactory results.

The region 22 of the first conductivity type may be either n- or p- type having a sheet resistivity of about 5 to 200 ohms per square and is preferably a heavily p-type conducting region having a sheet resistivity of about 20 ohms per square. This region is typically formed using diffusion techniques after the indentations are formed.

The region 24 of a second conductivity type has a conductivity opposite to that of the region 22 of the first conductivity type and is preferably n-type conducting, having a sheet resistivity of about 5-200 ohms per square and typically about 20 ohms per square.

The p-n junction occurs either at the interface 23 between the region 22 of the first conductivity type and the low conductivity region 20 or at the interface 25 between the region 24 of the second conductivity type and the low conductivity region 20, depending upon the conductivity types of the different regions. Typically, the low conductivity region 20 is lightly p-type conducting, the region 22 of the first conductivity type is p-type conducting, and the region 24 of the second conductivity type is n-type conducting. The p-n junction then occurs at the interface 25 between the region 24 of the second conductivity type and the low conductivity region 20.

The passivating layer 26, which overlies a portion of a second major surface 16 is an electrically insulating material, typically silicon dioxide about 0.5 micron thick which may be formed by standard thermal oxidation techniques. This layer may overlie a portion of the surface contiguous with the region 24 of the second conductivity type and is designed to reduce surface current leakage.

The electrically conducting layer 28 which overlies a portion of the second major surface 16, contiguous with the region 24 of the second conductivity type, serves as the electrical contact to this region and may also serve as a reflector of light transmitted through the diode to this interface. Typically the layer is a metal, or a sequence of metal layers, which will reflect the incident light.

The electrically conducting layer 30 forms the electrical contact to the first surface 14. This layer may be a transparent coating which may cover the entire surface including the portion through which light enters the photodiode or it may be a metal which covers a portion of the surface and extends around that portion of the surface through which light enters the device. The thickness and constituents of this layer are immaterial so long as the layer is electrically continuous and good electrical contact is made to the region 22 of the first conductivity type.

The anti-reflection coating 32 may overlie that portion of the first surface 14 through which light enters the device. The wavelength of the incident light and the optical index of refraction of the constituent materials of this layer will determine its thickness. A layer of silicon monoxide about 1350 Angstroms thick is suitable for an anti-reflection coating in the wavelength range of 1060 nanometers.

In the avalanche photodiode shown in FIG. 3, the region 22 of a first conductivity type, the low conductivity region 20 and the region 52 of a third conductivity type are all of the same conductivity type although having varying magnitudes of their conductivity. Typically, these regions are of a p-type conductivity with the region 22 of the first conductivity type heavily p-type conducting, the low conductivity region 20 lightly p-type conducting, and the region 52 of a third conductivity type having p-type conductivity. The p-n junction in this case is at the interface 54 between the region 24 of the second conductivity type and the region 52 of a third conductivity type.

The alternative arrangement to this where the n- and p-type conductivities are interchanged may be desirable in some materials such as III-V compounds. However, in silicon a carrier generated in the low conductivity region 20 which would be swept towards the p-n junction and detected would in this case be the hole. Since the ionization coefficient for holes in silicon is very low, the avalanche gain would also be very low thus making the arrangement less desirable, though feasible.

In FIG. 3 the contoured surface is opposed to the surface contiguous to the p-n junction. Alternatively, the surface contiguous to the p-n junction may be contoured although this is not the optimal configuration because of the high electric fields near the junction region. It is not necessary, however, that the light entry surface be contoured. Alternatively, light may enter the photodiode through the surface contiguous with the p-n junction and pass through the photodiode before striking the contoured surface.

A channel stop ring 58 having a conductivity of the same type as the low conductivity region 20 may be used to reduce surface leakage currents. The stop ring 58, which is typically formed by diffusion techniques, extends into the main body about 20 microns.

The indentations 18 are formed by etching through openings 96 in a barrier layer 94, as shown in FIG. 4, which overlies the first surface 14 of the semiconductor body 12. The barrier layer 94 is typically silicon dioxide having a thickness of about 0.8 micron, sufficient to mask the surface against the etchant used. The openings 96 in the barrier layer 94 may be formed by standard photolithographic techniques and etching the barrier layer 94. I have found that openings having dimensions which are small compared to the spacings between openings in the barrier layer 94 will produce, with etching, indentations which are close to hemispherically shaped. If, however, the openings in the barrier layer 94 become too small, then the etching action may not be uniform. The openings, which may be either circular or square, are typically about 12 microns in diameter and spaced about 50 microns apart in a regular array.

The exposed semiconductor body is then etched with an isotropic etchant which removes material both below the openings in the barrier layer 94 and laterally under the barrier layer 94, thus undercutting this layer as shown in FIG. 4. The etching process is stopped when the barrier layer is almost completely undercut at which point the indentations are almost touching one another in the direction of closest spacing of the openings. The barrier layer 94 is then removed and the etching process continued preferably until the indentations overlap along the direction of closest spacing. This overetching produces what is in effect an almost square pattern with rounded corners. I have found that continuing the etching process until the indentations are square does not produce as high a device quantum efficiency as compared to stopping the etch before the pattern has become square. The sharp edges that remain in the corners point away from the sensitive interior of the device and will thus not produce regions of high electric field.

A suitable isotropic etchant for use with the silicon semiconductor body is a solution of 70% by weight aqueous nitric acid, 48% by weight aqueous hydrofluoric acid, 100% by weight acetic acid, and deionized water in the ratio 18:2:1:1 by volume. Other etchants which will etch silicon isotropically may also be suitable for this use.

A measure of the performance of a photodiode is the quantum efficiency which is the ratio of the number of electron-hole pairs generated by absorption of the incident light beam and detected to the number of incident light quanta. A decrease in surface reflectivity will increase the number of light quanta which enter the photodiode and thus increase the quantum efficiency. An increase in the path length for optical absorption in the photodiode increases the number of electron-hole pairs generated and thus increases the quantum efficiency and the spectral response.

EXAMPLE 1

A p-i-n photodiode having a surface contoured in a regular array of indentations was fabricated and tested as follows.

A p-type silicon wafer having a resistivity about 3000 ohm-cm was used. A p-n junction was formed by diffusing an n-type dopant, here phosphorus, about 10 microns into a surface of the wafer.

A silicon dioxide barrier layer was then formed on the opposed surface using standard techniques. Square openings, 12 microns on a side and spaced about 50 microns apart, were formed in the silicon dioxide layer using standard photolithographic techniques. The silicon surface beneath the barrier layer was then etched for about four minutes using the isotropic nitric acid, hydrofluoric acid and acetic acid etchant described above, at which point the silicon dioxide layer was almost completely undercut. The etching was stopped, the silicon dioxide layer was removed, using an etchant specific to this layer and the silicon surface was etched again in the isotropic etchant for about 30 to about 45 seconds. The indentations formed, which overlapped one another in the direction of closest spacing of the openings in the silicon dioxide layer, had a depth of about 25 microns and a center to center spacing of about 50 microns.

The contoured surface was then diffused with boron to form a p+ region contiguous with this surface. A metallic layer was then evaporated onto a portion of this surface to make electrical contact to the p+ region. A silicon monoxide anti-reflection coating about 132.5 nanometers thick was applied to the contoured surface using standard evaporation techniques. A light reflective and electrically conducting layer was then formed on the surface opposed to the contoured surface by sequentially evaporating about 1000 Angstroms of aluminum, about 500 Angstroms of chromium and about 2500 Angstroms of gold.

The p-i-n photodiode thus fabricated was tested by exposure to a beam of 1060 nanometer radiation. The quantum efficiency of the device, having a sensitive thickness of about 150 microns, was measured to be about 47% as compared to 24% for a device with the same effective thickness which was fabricated using the same processes but absent the contoured surface.

EXAMPLE 2

An avalanche photodiode having a surface contoured in a regular array of indentations was fabricated and tested as follows.

A p-type silicon wafer having a resistivity of about 3000 ohm-cm. was used. A p-type conducting layer was formed in one major surface of the wafer by ion implantation and drive-in diffusion. An n-type conducting layer was then formed in a region contiguous to this surface by standard diffusion techniques forming a p-n junction between these two layers.

The opposed surface was then contoured and doped and the electrical contacts, and reflecting and antireflecting layers formed as in Example 1.

An avalanche photodiode fabricated by this method and having a sensitive thickness of about 110 microns was then exposed to a beam of 1060 nanometer radiation. At a reverse bias of 30 volts, less than the avalanche threshold, the avalanche photodiode had a quantum efficiency of about 41% as compared to a quantum efficiency of 20% for an avalanche photodiode with the same effective thickness which was fabricated in the same manner except for the absence of the contoured surface.

The avalanche photodiode fabricated with a contoured surface and fabricated by the process described above was found to have significantly improved gain uniformity for 1060 nanometer radiation across the surface of an individual device by illuminating only a portion of the sensitive area and an improved yield in devices from a wafer.

I claim:

1. In a photodiode which comprises:
    a semiconductor body having two opposed surfaces;
    a first conducting region of a first conductivity type extending a distance into said body from a first surface of said body;
    a second conducting region of a second conductivity type extending into said body from a second surface of said body, such that said regions of first and second conductivity type do not overlap;
    first and second electrically conducting layers overlying portions of said first and second conducting regions, respectively, whereby electrical contact is made to said first and second conducting regions;
    the improvement which comprises a portion of the surface of said first conducting region being contoured in the form of a regular array of almost hemispherically shaped indentations extending a distance into said body, wherein sharp points in the indented surface are directed away from the interior of the body, thereby minimizing the formation of local regions of high electric field in the interior of the body.

2. A photodiode according to claim 1 wherein a third region of a conductivity type opposite to that of said region of the second conductivity type is interposed between said region of the second conductivity type and said body and is contiguous with said region of the second conductivity type, whereby a p-n junction is formed between said region of the second conductivity type and said third region.

3. A photodiode according to claim 2 wherein said semiconductor body is lightly p-type conducting, said region of the first conductivity type and said third region are p-type conducting and said region of the second type conductivity is n-type conducting.

4. A photodiode according to claim 1 wherein said semiconductor body is lightly p-type conducting, said region of the first conductivity type is n-type conducting and said region of the second conductivity type is p-type conducting.

5. A photodiode according to claim 1 wherein the diameter of said indentations on said surface is from about 3 microns to about 100 microns.

6. A photodiode according to claim 5 wherein the diameter of said indentations on said surface is from about 25 microns to about 75 microns.

7. A photodiode according to claim 1 wherein the depth of said indentations is from about 2 microns to about 50 microns.

8. A photodiode according to claim 7 wherein the depth of said indentations is from about 12 to about 35 microns.

9. A photodiode according to claim 1 wherein said indentations overlap one another along the direction of closest spacing.

* * * * *